United States Patent [19]

Vladik

[11] 3,708,851

[45] Jan. 9, 1973

[54] HOLDING DEVICE FOR SEMICONDUCTOR WAFERS

[75] Inventor: Liboslav Vladik, Nurnberg, Germany

[73] Assignee: Semikron Gesellschaft fur Gleichrichterbau und Elektronick mbH, Nurnberg, Germany

[22] Filed: Nov. 30, 1970

[21] Appl. No.: 93,821

[30] Foreign Application Priority Data

Nov. 29, 1969 Germany....................P 19 60 121.9

[52] U.S. Cl. ........................29/203, 29/577, 269/287

[51] Int. Cl. ........................................................H01g

[58] Field of Search......29/200 P, 203 P, 203, 203 B; 269/283, 287

[56] References Cited

UNITED STATES PATENTS

| | | | |
|---|---|---|---|
| 3,166,372 | 1/1965 | Just | 29/203 B |
| 3,574,919 | 4/1971 | Reppert | 29/203 P |
| 3,555,660 | 1/1971 | Bankes et al. | 29/203 P |
| 3,616,510 | 11/1971 | Kroehs | 29/203 B |

*Primary Examiner*—Charles W. Lanham
*Assistant Examiner*—W. Tupman
*Attorney*—Spencer & Kaye

[57] ABSTRACT

The semiconductor wafers for a rectifier circuit of the type wherein the conductors are formed from a single sheet of conductive material and shaped so that wafers may be inserted therebetween, are all simultaneously inserted and held in place by means of a holding device or jig which then remains in the finished device. The holding device is a sheet or plate of synthetic material having perforations or openings corresponding to the desired locations of the wafers in circuit arrangement and having a thickness substantially equal to that of the wafers. The wafers are held or mounted in the perforations by static friction as a result of an elastic layer provided between the walls of the perforation and the edges of the wafer.

12 Claims, 6 Drawing Figures

HOLDING DEVICE FOR SEMICONDUCTOR WAFERS

BACKGROUND OF THE INVENTION

The present invention relates to semiconductor rectifier circuits and in particular such rectifier circuits wherein a plurality of semiconductor diode wafers are inserted and connected to a planar pattern of conductors to form the desired circuit.

Semiconductor rectifier circuit devices have been proposed wherein the conductive portions of the circuit are produced in large numbers from planar geometric structures from sheet or tape-type conductive material and form clamp-shaped mountings for holding and contacting the semiconductor wafers. Semiconductor rectifier circuits constructed in this manner are disclosed in copending U.S. patent application Ser. No. 8,996, filed Feb. 5, 1970 by W. Schierz which is assigned to the same assignee as the present application.

FIG. 1 is a schematic representation of such a conductor structure, the geometrical arrangement of which is determined by the desired rectifier circuit, having semiconductor wafers inserted between the conductors. As illustrated, section 12 of conductor portion 11 is bent out of the plane of the sheet of conductive material and is formed so that it overlies the adjacent large-area conductor portion 13 to provide a clamp-type mount therewith for a semiconductor wafer 14. The synthetic sheathing or housing for the device is indicated by the numeral 15. The bars 16 and 17 represent auxiliary bars which are preferably provided during the manufacturing process, but are later removed, to provide greater rigidity to the conductors prior to the formation of the housing.

When placing a semiconductor wafer 14 onto each one of the clamp-type mounts formed by such a partial conductor structure, e.g. the clamp-type mount between conductors 12 and 13, several difficulties arise which tend to hamper the production process for miniature rectifier circuits and moreover tend to cause additional production costs. For example, a slight undesired bend in one of the conductor portions associated with a semiconductor wafer may cancel out its clamping effect and thus completely eliminate the desired positioned holding of the semiconductor wafers. Additionally, as a result of insufficient spring pressure, the individual semiconductor wafers may be washed out of their mounts upon their immersion into a solder bath in order to permanently connect the wafers to the associated leads. Moreover, the individual insertion of the semiconductor wafers and their alignment with the clamp-type mounts is time consuming which is undesirable for economic fabrication.

SUMMARY OF THE INVENTION

It is, therefore, the object of the present invention to eliminate these difficulties and drawbacks of the prior art manufacturing techniques and to realize a more economical fabrication procedure for placing or inserting the semiconductor wafers in the partial conductor structures and for their further processing.

The above object is achieved according to the present invention by providing a mounting device for simultaneously placing the semiconductor wafers in their proper positions into the partial conductor structures during the manufacture of miniature semiconductor rectifiers. The holding or mounting device consists of a plate, bar or tape of synthetic material which is resistant to the stresses occurring during the solder contacting of the semiconductor wafers, and has a thickness which is substantially the same, i.e., equal or slightly less, than that of the semiconductor wafers to be held. The plate, bar or tape-shaped device is provided with a plurality of perforations, holes or cutouts for holding the semiconductor wafers, with the mutual spatial association of these perforations corresponding to the predetermined position and spacing of the semiconductor wafers in the conductor structure of the intended rectifier circuit. To hold the semiconductor wafers in the perforations, an elastic intermediate layer is provided between the edge surfaces of the semiconductor wafers and the mounting surfaces or walls of the perforations whereby the wafers are held in the perforations by friction. Thus, with such a holding device, all of the wafers of a circuit or of a plurality of circuits can be simultaneously inserted into the partial conductor structures and, due to the total contact surface area between the holding device, including the wafers, and the conductors, the wafers will be securely held in place during the further processing.

According to a further feature of the invention, the perforations in the holding device may be provided in a matrix of rows and columns and semiconductor wafers inserted, e.g. automatically, into only those perforations corresponding to desired wafer locations in the geometrical pattern of conductors of the circuit.

DESCRIPTION OF THE PREFERRED EMBODIMENTS

Figure 2:
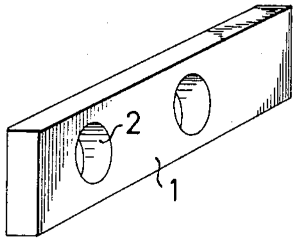
FIG. 2 is a perspective view of a device according to the invention for holding and inserting the semiconductor wafers into the conductor structure.

Referring now to the figures wherein the same parts bear the same reference numerals in all figures, in FIG. 2 there is shown a holding device according to the invention comprising a rectangular plate or bar 1 having perforations, bores, or openings 2. The bores 2 are arranged or positioned so that they coincide, as regards their spatial association, with the location of the semiconductor wafers required for the desired rectifier circuit, i.e. the illustrated plate is intended for a rectifier circuit having two diodes whose spatial location corresponds to that of the two bores 2. In order to assure proper contacting between the semiconductor wafers and the conductor portions forming the clamp-type mountings, the thickness of the plate 1 is selected to be substantially that of the semiconductor wafers. Preferably, the thickness of the plate 1 is equal to or slightly less than that of the wafers. The areal expanse of the plate 1 is selected in dependence on the area of the conductor structure intended for the respective rectifier circuit. The diameter of bores 2 is determined by the diameter of the semiconductor wafers to be held or mounted therein and by the thickness of an elastic intermediate layer, to be discussed below, which is preferably applied to the edge surfaces of the semiconductor wafers. Since the device according to the present invention is intended to remain in the conductor structure during the further processing and in fact remains in the finished device, it is formed of a synthetic material which can resist the stresses occurring during solder contacting of the semiconductor wafers, as well as also having properties which meet the electrical requirements, e.g. an insulator. Preferably, the plate 1 is formed of silicone, pressed epoxy masses or of phenol resins which have these desired properties.

Figure 3:
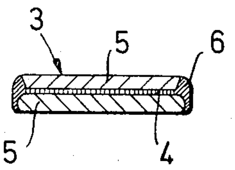
FIG. 3 is a sectional view of a semiconductor wafer of the type utilized with the present invention.

FIG. 3 is a sectional view of a semiconductor wafer of the type intended to be placed in the bores 2 of holding device plate 1 according to the present invention. The semiconductor wafer 4 which, in a well-known manner contains a planar PN-junction which extends to the edge or periphery of the wafer, is permanently connected on both of its major surfaces with contacting plates 5 of a material which has good electrical and thermal conductive properties and a coefficient of thermal expansion which approximates that of the semiconductor material, e.g. Kovar or molybdenum in the case of a silicon wafer. The edge surface or periphery of the wafer, at least in the area where the pn-junction exits, is covered with a protective coating 6 which serves to stabilize and conserve the blocking characteristics of the semiconductor wafers. Preferably the protective coating 6 is formed from a material such that it can also serve as the above-mentioned elastic intermediate layer utilized to hold the semiconductor wafers 3 in the perforations or bores 2 of the device. In order to be able to simultaneously serve this dual purpose, the protective layer or coating 6 preferably consists of a suitable elastic synthetic, for example, of silicone rubber.

These semiconductor wafers, which are frequently referred to as sandwiches, are provided, depending on the given areal expanse, with substantially identical outer diameters, as measured including the elastic intermediate layer 6, such that after insertion into the adapted holes or bores 2 of the device 1, the wafers will be held sufficiently firmly solely due to static frictional forces. For example, for a wafer diameter of 3.4 mm the associated bore diameter is approximately between 3.1 and 3.2 mm.

When semiconductor wafers are to be used which have a surface protective layer 6 which is not simultaneously usable as the elastic layer for mounting the wafers 3 in the bores 2 of the device according to the present invention, the mounting surfaces, i.e., the walls, of the perforations in the device 1, may be provided with a suitable elastic intermediate layer before the semiconductor wafers are inserted.

Figure 4:
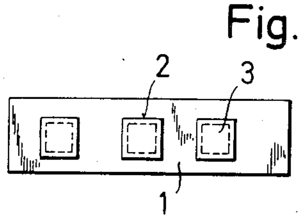
FIGS. 4 and 5 are plan views of further embodiments of devices according to the invention for simultaneously holding three or four wafers, respectively.
Figure 5:
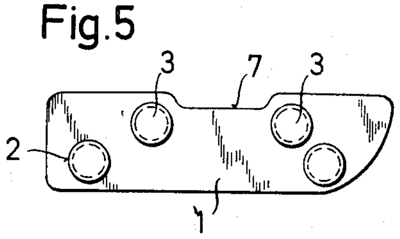

FIGS. 4 and 5 show, in a plan view, a device 1 suited for a miniature rectifier having three or four semiconductor wafers 3, respectively, which device is constructed, as regards its shape and the arrangement of the holes 2, to be adapted to a particular desired conductive structure. Additionally, instead of circular holes or bores, the perforations in the device 1 may have any desired shape, e.g. polygonal.

The mounting device 1 which was preferably produced by a pressing process, may, as indicated above, also be designed in a bar shape depending on the desired rectifier arrangement. Additionally, for the economic simultaneous production of a plurality of miniature semiconductor rectifiers the device 1 according to the invention may also take the form of a periodic band-type structure which corresponds to the division of the provided partial conductor structures. Moreover, a said periodic band-type structure may be utilized in the manufacture of a plurality of holding devices according to the present invention by providing a band of material with a plurality of bores or recesses arranged in a continuous grid-like manner in rows and columns which are then selectively provided with semiconductor wafers corresponding in their mutual spatial association with that of the contact points or clamp-type mounts of the partial conductor structures and in an arrangement determined by the desired circuit configuration. This selective insertion of the wafers into the bores may be performed in a well-known manner, in a suitable processing cycle, e.g., by means of mechanically or automatically operating inserting machines and thereafter the holding devices 1 provided with the semiconductor wafers 3 may be inserted, in the appropriate process step sequence, into the partial conductor structures.

Figure 1:
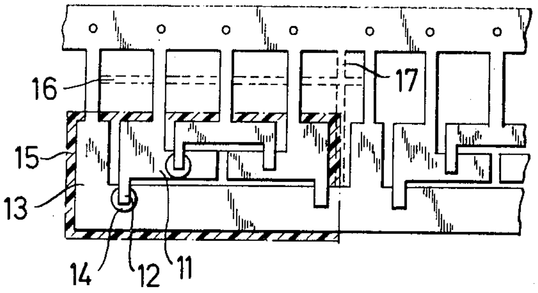
FIG. 1 is a schematic illustration of a conductor structure according to the prior art of the type to which the present invention is directed.
Figure 6:
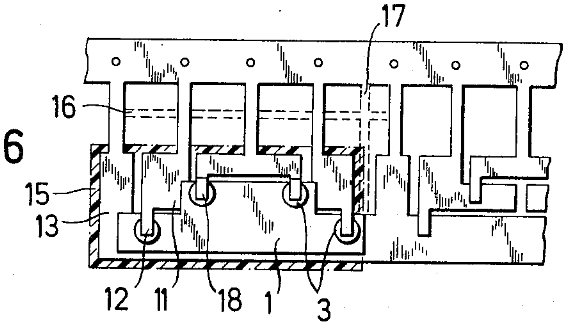
FIG. 6 is a schematic plan view of the conductor structure of FIG. 1 wherein the wafers are held and inserted by means of a device according to the invention to form a single phase bridge circuit.

FIG. 6 shows the arrangement of the holding device 1 according to the present invention in the partial conductor structure shown schematically in FIG. 1 and intended for use as a single-phase bridge circuit. As illustrated, the holding device 1 which is adapted in its areal expanse and shape to that of the conductor structure is inserted at the extended edge of the conductor 13 between the clamp-type mounts in the appropriate association until it abuts at the partial conductor strips 12 which are arranged to overlap, for example, by bending, an underlying conductor, e.g. the conductor portion 12 of conductor 11 overlaps conductor 13 while the conductor portion 18 overlaps conductor portion 11. Thus, the two contacting plates 5 of each wafer contact the respective conductors, e.g. the conductors 12 and 13 or the conductors 18 and 11. As illustrated the underlying conductors 11 and 13 are designed to have large surface areas in order to dissipate the generated heat.

In order not to impede the temperature behavior of the circuit arrangement by excess covering of these large area partial conductor sections, the holding device 1 may be provided with at least one closed recess or opening, or a recess extending from the edge zones between the semiconductor wafers, e.g., the recess 7 in FIG. 5. The clamp-shaped mounts formed by the associated conductors and the abutment of the edge of the holding device against the bent partial conductor strips, e.g., the strips 12 and 18, sufficiently fix or position the holding device 1 so as to permit the required further process steps on the semiconductor wafers to be carried out.

The advantages of the holding device according to the present invention are that inserting the semiconductor wafers into the holding device takes substantially less time than that required to individually insert the wafers into the clamp-type mount or the partial conductor structures; that at least all the semiconductor wafers for the partial conductor regions of each given rectifier circuit can be inserted at the same time and can be mounted in a predetermined spatial association; and that the correct position and the correct mounting of each semiconductor wafer is assured when further process steps take place in the manufacture of miniature rectifiers.

It will be understood that the above description of the present invention is susceptible to various modifications, changes and adaptations, and the same are intended to be comprehended within the meaning and range of equivalents of the appended claims.

I claim:

1. A device for holding and correctly positioning semiconductor wafers in planar conductive path structures during the manufacture of miniature semiconductor rectifier arrangements, comprising:

a plate of a synthetic material which is resistant to the stresses occurring during the solder contacting of the semiconductor wafers, said plate having a thickness which is substantially the same as that of said wafers;

a plurality of perforations formed in said plate with the surfaces of said plate which define said perforations constituting mounting surfaces for said wafers, said wafers being mounted in said perforations, said perforations having a mutual spatial relationship in said plate corresponding to the positioning and spacing of the semiconductor wafers in the conductive path structure of the rectifier arrangements; and, a layer of an elastic material between the edge surfaces of said semiconductor wafers and said mounting surfaces whereby said wafers are mounted in said perforations by static friction.

2. The holding device as defined in claim 1 wherein said elastic layer is formed on the edge surfaces of said wafers prior to insertion of said semiconductor wafers into said perforations.

3. The holding device as defined in claim 1 wherein said elastic layer is formed on said mounting surfaces of said perforations prior to the insertion of said semiconductor wafers into said perforations.

4. The holding device as defined in claim 2 wherein said elastic layer simultaneously serves as a protective lacquer for stabilizing the blocking characteristics of the semiconductor surface.

5. The holding device as defined in claim 1 wherein said elastic layer is formed of silicone rubber.

6. The holding device as defined in claim 3 wherein said perforations have a round cross section.

7. The holding device as defined in claim 3 wherein said perforations have a polygonal cross section.

8. The holding device as defined in claim 1 wherein said synthetic material utilized for said plate is silicone.

9. The holding device as defined in claim 1 wherein said synthetic material utilized for said plate is a pressed epoxy mass.

10. The holding device as defined in claim 1 wherein said synthetic material utilized for said plate is a phenol resin.

11. The holding device as defined in claim 1 wherein said plate is provided with a plurality of said perforations arranged in a grid of rows and columns and wherein the semiconductor wafers are mounted in only those perforations corresponding to the positions desired of the semiconductor wafers in the circuit arrangement.

12. The holding device as defined in claim 11 wherein the geometrical pattern of conductors periodically repeats itself, and wherein the pattern of wafers in said plate similarly periodically repeats itself, whereby the wafers for a plurality of devices may be simultaneously inserted into the respective conductor patterns.

* * * * *

UNITED STATES PATENT OFFICE
CERTIFICATE OF CORRECTION

Patent No. 3,708,851 Dated January 9th, 1973

Inventor(s) Liboslav Vladik

It is certified that error appears in the above-identified patent and that said Letters Patent are hereby corrected as shown below:

In the heading of the patent, line 6, change "Elektronick" to --Elektronik--.

Signed and sealed this 10th day of July 1973.

(SEAL)
Attest:

EDWARD M.FLETCHER,JR.
Attesting Officer

Rene Tegtmeyer
Acting Commissioner of Patents

FORM PO-1050 (10-69)

USCOMM-DC 60376-P69
☆ U.S. GOVERNMENT PRINTING OFFICE : 1969 O—366-334